US008940585B2

(12) United States Patent
Liou et al.

(10) Patent No.: US 8,940,585 B2
(45) Date of Patent: Jan. 27, 2015

(54) SINGLE LAYER BGA SUBSTRATE PROCESS

(71) Applicant: Marvell World Trade Ltd., St. Michael (BB)

(72) Inventors: Shiann-Ming Liou, Campbell, CA (US); Huahung Kao, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/212,517

(22) Filed: Mar. 14, 2014

(65) Prior Publication Data
US 2014/0206152 A1 Jul. 24, 2014

Related U.S. Application Data

(63) Continuation of application No. 13/358,405, filed on Jan. 25, 2012, now Pat. No. 8,673,689.

(60) Provisional application No. 61/485,543, filed on May 12, 2011, provisional application No. 61/437,200, filed on Jan. 28, 2011.

(51) Int. Cl.
*H01L 21/00* (2006.01)
*H01L 21/50* (2006.01)
(Continued)

(52) U.S. Cl.
CPC .............. *H01L 21/50* (2013.01); *H01L 21/486* (2013.01); *H01L 23/49861* (2013.01); *H01L 21/4832* (2013.01); *H01L 23/49816* (2013.01);
(Continued)

(58) Field of Classification Search
CPC ...................... H01L 21/4832; H01L 23/49861

USPC .......... 438/21, 121, 670; 257/E21.51; 216/19
See application file for complete search history.

(56) References Cited

U.S. PATENT DOCUMENTS 6,255,740 B1 7/2001 Tsuji et al.
6,562,660 B1 5/2003 Sakamoto et al.
(Continued)

FOREIGN PATENT DOCUMENTS

DE 102005047106 4/2007
WO WO2009041044 2/2009
(Continued)

OTHER PUBLICATIONS

PCT Search Report mailed Jul. 10, 2012 for PCT application No. PCT/US12/22776, 15 pages.

*Primary Examiner* — Caridad Everhart

(57) ABSTRACT

The present disclosure provides semiconductor packaging techniques that form a substrate using metal and insulating materials. The substrate includes a first surface that is bonded to a semiconductor device and a second surface that is bonded to a printed circuit board. The substrate is formed using several techniques that minimize the amount of mask levels used to form the substrate. For example, a metal substrate is patterned to form a three dimensional pattern on the surface. A dielectric material is deposited on the three dimensional pattern. Using several patterning and polishing embodiments described herein, the metal/dielectric substrate is patterned and polished to form a substantially flush surface that is bonded to the semiconductor device. In one embodiment, the top surface of the metal/dielectric substrate is patterned to expose the underlying metal substrate and the bottom surface of the metal substrate is polished to be substantially flush with the dielectric material.

14 Claims, 4 Drawing Sheets

(51) Int. Cl.
*H01L 21/48* (2006.01)
*H01L 23/498* (2006.01)

(52) U.S. Cl.
CPC ............... *H01L2924/09701* (2013.01); *H01L 2224/48091* (2013.01); *H01L 2924/15311* (2013.01)
USPC .......................................... 438/121; 438/670

(56) References Cited

U.S. PATENT DOCUMENTS

| | | | |
|---|---|---|---|
| 7,838,380 B2 | 11/2010 | Kwon et al. | |
| 8,673,689 B2 * | 3/2014 | Liou et al. | 438/121 |
| 2005/0206014 A1 | 9/2005 | Sakamoto et al. | |
| 2005/0287711 A1 | 12/2005 | Huang et al. | |
| 2006/0006504 A1 | 1/2006 | Lee et al. | |
| 2006/0223240 A1 | 10/2006 | Yang | |
| 2007/0090537 A1 | 4/2007 | Shim et al. | |
| 2008/0308925 A1 | 12/2008 | Shen | |
| 2009/0068797 A1 * | 3/2009 | Shen et al. | 438/124 |
| 2009/0127682 A1 | 5/2009 | Kim et al. | |
| 2010/0052118 A1 | 3/2010 | Galera et al. | |
| 2010/0207270 A1 * | 8/2010 | Yanase et al. | 257/737 |
| 2011/0163435 A1 | 7/2011 | Tsukamoto et al. | |
| 2011/0298126 A1 | 12/2011 | Tsai et al. | |
| 2012/0097430 A1 * | 4/2012 | Chou et al. | 174/251 |
| 2013/0052796 A1 * | 2/2013 | Saito et al. | 438/455 |
| 2014/0054785 A1 * | 2/2014 | Wang | 257/773 |

FOREIGN PATENT DOCUMENTS

| | | |
|---|---|---|
| WO | WO2010013470 | 2/2010 |
| WO | WO2010038452 | 4/2010 |

* cited by examiner

SINGLE LAYER BGA SUBSTRATE PROCESS

CROSS REFERENCE TO RELATED APPLICATIONS

The present disclosure is a continuation of and claims priority to U.S. patent application Ser. No. 13/358,405, filed on Jan. 25, 2012, now U.S. Pat. No. 8,673,689, issued Mar. 18, 2014, which claims priority to U.S. Provisional Patent Application No. 61/437,200, filed Jan. 28, 2011, and U.S. Provisional Patent Application No. 61/485,453, filed May 12, 2011, which are incorporated herein by reference.

TECHNICAL FIELD

Embodiments of the present disclosure relate to the field of integrated circuits, and more particularly, to techniques, structures, and configurations of semiconductor chip packaging.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A semiconductor package is a casing—e.g., composed of metal, plastic, glass, ceramic, or other material—containing one or more semiconductor devices. A semiconductor package generally provides protection against impact and corrosion, and supports contact pins or leads which are used to connect a semiconductor device within the semiconductor package to a circuit external to the semiconductor package. A semiconductor package typically includes a number of components—for example, a substrate composed of several layers, metal traces, and ball pads. Multiple patterning steps are typically required to respectively form the several layers of a substrate, as well as to define the metal traces and ball pads used in packaging a semiconductor device. Minimizing the amount of patterning steps can reduce the cost of manufacturing semiconductor devices.

SUMMARY

This disclosure relates to methods for forming a substrate for supporting a semiconductor device that is bonded to the substrate. In one implementation, a three-dimensional pattern is formed on a top surface of a metal substrate. A dielectric layer is deposited over the three-dimensional pattern and is patterned to expose the underlying metal substrate. The bottom surface of the metal substrate is also patterned to expose the dielectric material that was deposited on the top surface of the metal substrate.

In another implementation, a three-dimensional pattern is formed on a top surface of metal substrate. An insulating material is deposited on the top surface of the metal substrate. A portion of the insulating material is removed so that the top surface of the metal substrate is substantially flush with the remaining insulating material. Then, a portion of a bottom surface of the metal substrate is removed so that the bottom surface of the metal substrate is substantially flush with the insulating material deposited on the top surface of the metal substrate. A first mask layer is then formed on the top surface of the substrate along with a second mask layer that is formed on the bottom surface of the substrate.

In yet another implementation, a metal/dielectric substrate is formed using a metal substrate with an insulating material that is patterned to expose the underlying metal substrate. A semiconductor device is bonded to the top surface patterned metal/dielectric substrate and the bottom surface of the metal substrate is polished until the metal substrate is substantially flush with the insulating material that was deposited on the top surface of the metal substrate.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Figure 1:
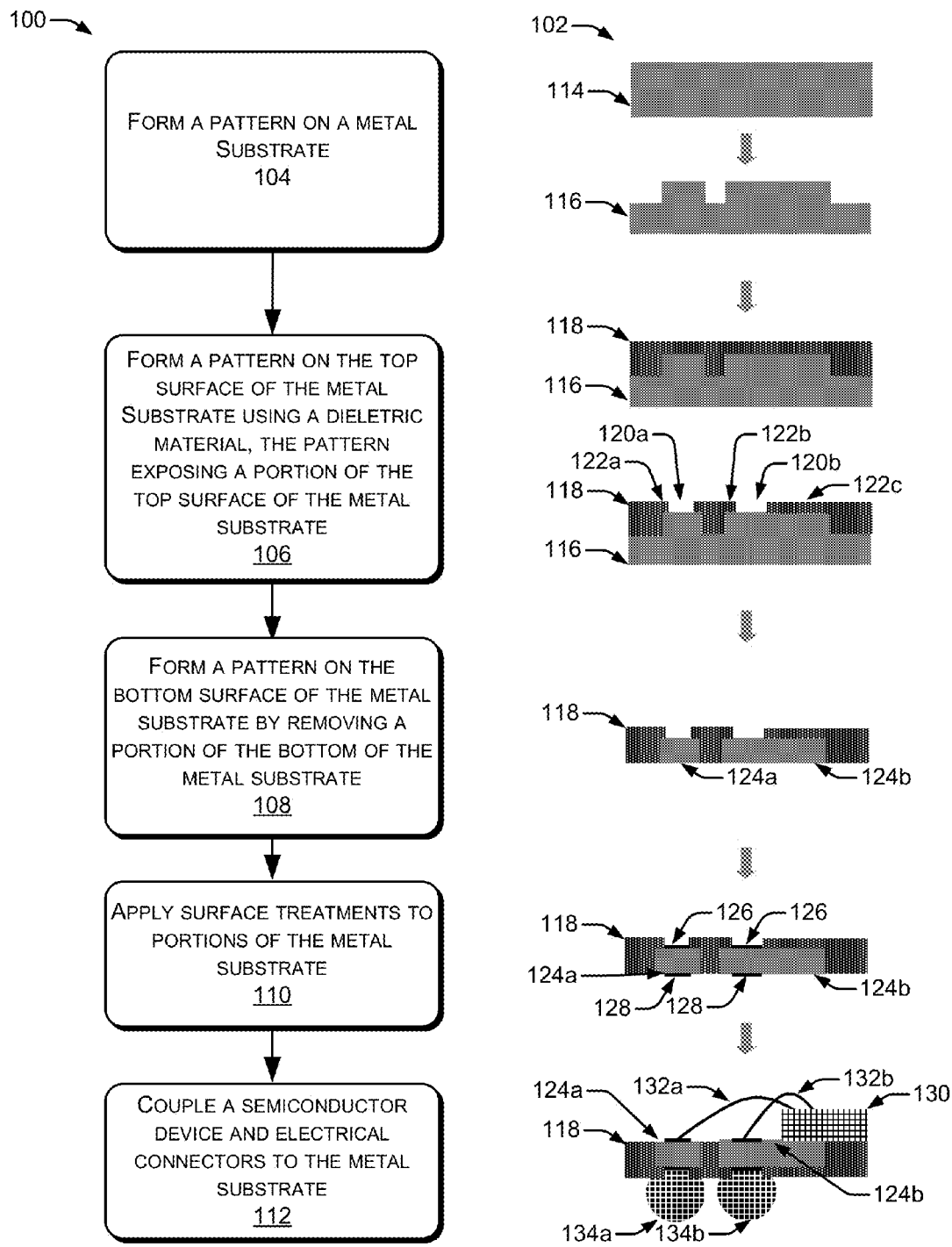
FIG. 1 illustrates a process flow diagram that describes steps that can be used during manufacture of a semiconductor package along with side view illustrations that correspond to the steps in the process flow diagram.

FIG. 1 illustrates a process flow diagram 100 of steps that can be used during the manufacturing of a semiconductor package. FIG. 1 also includes side view illustrations 102 corresponding to the steps in the process flow diagram 100. The side view illustrations for each step are located to the right of the step in the process flow diagram 100.

At 104, a metal substrate 114 is patterned to create a three dimensional pattern in the top surface of the metal substrate 114. In one embodiment, the metal substrate 114 is etched to create a patterned substrate 116 that will be the foundation for the semiconductor package. In this embodiment, the patterned substrate 116 is a two level pattern, with a portion of the patterned substrate 116 being above the etched portion of a top surface of the patterned substrate 116. The etched portion of the patterned substrate 116 defines indentations or grooves that form the basis of a three dimensional pattern that is device specific based upon the size of the semiconductor package, the number of input/output connections for the semiconductor package, and the type of connectors used for the input-put connections. For example, the arrangement of the three dimensional pattern is determined based upon the type of packaging requirements that needs to be accommodated, e.g., Ball-Grid Array (BGA), Quad-Flat Pack (QFP), Quad-Flat No Leads (QFN), flip-chip, wire bonded, or any other semiconductor packaging scheme.

In another embodiment, a plating process can be used to add additional metal to the metal substrate 114 to create a three dimensional pattern on the surface of the metal substrate, as opposed to the aforementioned etching process.

At 106, another pattern is formed on top of the patterned substrate 116 by depositing a dielectric material 118 and selectively removing portions of the dielectric material 118 to expose portions 120a, 120b of the underlying patterned metal substrate 116. The exposed portions 120a, 120b provide contact areas that can be used to electrically connect a semiconductor device (not shown) or external electrical connectors that will couple the patterned metal substrate 116 to a printed circuit board (not shown). As can be seen, in this embodiment, the dielectric material 118 on the top surface overlaps the patterned metal substrate 116 to define upper contact regions 120a, 120b, by the overlapping regions of dielectric material 122a, 122b, 122c. The overlap portion 122c can support semiconductor devices or electrical connectors that facilitate connecting a completed semiconductor package to a printed circuit board (not shown).

At 108, a pattern is formed on the bottom of the patterned metal substrate 116 by selectively removing a bottom portion of the patterned metal substrate 116 until the bottom of the patterned metal substrate 116 at portions 124a, 124b is substantially flush with the dielectric material 118. The lower surfaces of the portions 124a, 124b define lower contact regions that do not have any overlapping dielectric material 118 unlike the upper contact regions 120a, 120b described above. The removal process can comprise a grinding or chemical mechanical polishing process or, alternatively, a wet or dry chemical etch process.

In one embodiment, the remaining portions 124a, 124b of the patterned metal substrate 116 are electrically isolated from each other by the dielectric material 118. These metal regions 124a, 124b form an electrical via that allows current to flow to/from the top of the upper portions of the patterned metal substrate 116 from/to the bottom portions of the patterned metal substrate 116. In this embodiment, the upper contact regions 120a, 120b of the remaining portions 124a, 124b are substantially smaller in surface area than the lower contact regions of the bottom surfaces of the metal regions 124a, 124b due to the overlap portions 122a, 122b, 122c. The differences in surface can be dictated by the type of semiconductor packaging scheme (e.g., BGA, QFN, . . . etc.) being used or the device bonding scheme (e.g., flip-chip, wire bond).

In other embodiments, the metal regions 124a, 124b may not always be electrically isolated from each other, but, in general, at least a majority of the metal regions 124a, 124b will be electrically isolated from each other.

At 110, surface treatments 126, 128 can be applied to the upper and lower contact regions, respectively, to improve bonding strength of a desired bonding scheme being used. In other embodiments, the surface treatments are not required and are not used. In such other embodiments, the specials treatments can be omitted from the manufacturing process.

At 112, a semiconductor device 130 is coupled to the bottom surface of the metal region 124b and/or the bottom surface of dielectric material region 122c using any adhesive material or techniques. The lower contact regions on the metal regions 124a, 124b have a larger surface area than the upper contact regions 120a, 120b. Smaller surface contact regions on the top surface enable a higher density of electrical connectors 134 to be coupled to the substrate at the contact regions 120a, 120b. In this embodiment, the electrical connectors are metal spheres or solder balls 134 that form a BGA packaging arrangement. The semiconductor device 130 is also wire bonded to the metal regions 124a, 124b using metal wires 132. The metal wires 132 provide an electrical conduit for electrical signals to be sent to and from the device 130 to a printed circuit board (not shown). For example, the signals travel from/to the semiconductor device 130 via the metal wires 132, through the metal regions 124a, 124b, through the metal spheres 134 and to/from a printed circuit board (not illustrated). The two illustrated metal regions 124a, 124b are electrically isolated from each other to maintain the integrity of the signals being sent or received from the device 130. The metals wires 132 and metal spheres 134 may be comprised of aluminum, gold, copper, or silver.

In other embodiments (not illustrated), the semiconductor device 130 can be electrically connected directly to the metal regions 124a, 124b via metal spheres instead of metal wires 132. For example, metal spheres can be used to couple the device 130 to the substrate and another set of metal spheres 134 can couple the substrate to a printed circuit board (not shown).

Figure 2:
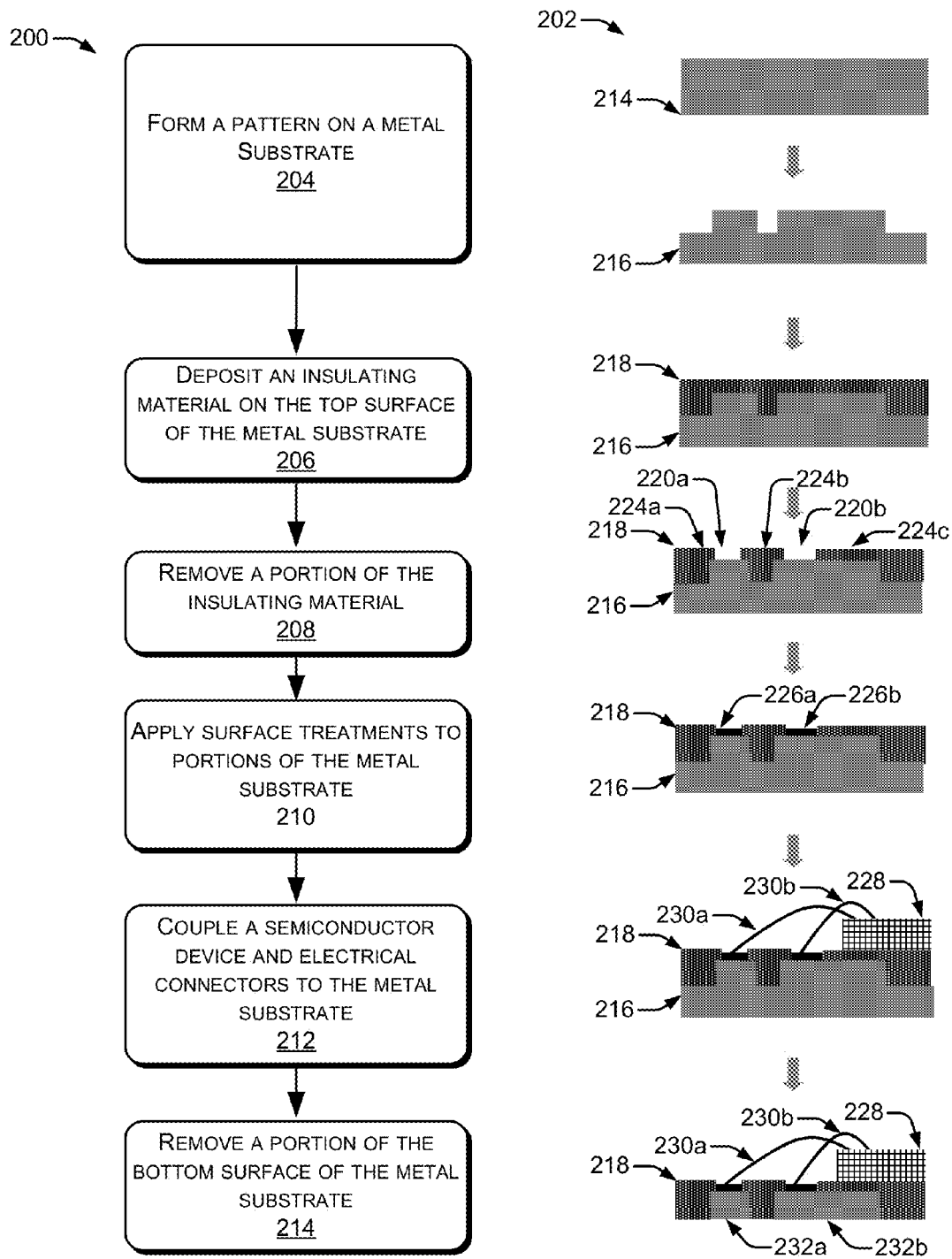
FIG. 2 illustrates another process flow diagram that describes steps that can be used during manufacture of a semiconductor package along with side view illustrations that correspond to the steps in the process flow diagram.

FIG. 2 illustrates a process flow diagram 200 of steps that can be used during the manufacturing a semiconductor package, and also illustrates side view illustrations 202 corresponding to the steps in the process flow diagram 200. The side view illustrations for each step are located to the right of the step in the process flow diagram 200.

At 204, a metal substrate 214 is patterned to create a three dimensional pattern in the top surface of the metal substrate 214. In one embodiment, the metal substrate 214 is etched to create a patterned metal substrate 216 that will include the foundation for the semiconductor package. In this embodiment, the patterned metal substrate 216 is a two level pattern similar to the pattern described in FIG. 1. Again, the pattern is device specific and dependent upon the desired packaging scheme.

In another embodiment, a plating process can be used to add additional metal to the metal substrate 214 to create a three dimensional pattern on the surface of the metal substrate, as opposed to the aforementioned etching process.

At 206, an insulating material 218 is deposited on the top surface of the patterned metal substrate 216. The insulating material can be any type of epoxy based material (e.g., Intervia™, Dow Chemical Co., 1500 John Tipton Blvd., Pennsauken, N.J. 08110) or silicon based material (e.g., $SiO_2$, $Si_2N_4$, Tetraethyl Orthosilicate (TEOS), Boronphosphosilicate glass (BPSG) or Phosphossilicte glass (PSG)). The deposition process may include any chemical vapor deposition process or chemical bath that can conformably apply the insulating material to the patterned metal substrate 216.

At 208, the insulating material 218 is patterned and portions of the insulating material 218 is removed to form a pattern that exposes portions 220a, 220b of the patterned metal substrate 216 through the insulating material 218. The exposed portions 220a, 220b may also be referred to as upper contact regions that can be placed in electrical communication with other electrical components (not shown). The patterning process may be accomplished by any variety of lithography and etch techniques. This embodiment also includes portions of the dielectric material 224a, 224b, 224c that overlap the patterned metal substrate 216

At 210, the exposed areas 220a, 220b of the patterned metal substrate 216 are coated or treated with materials 226a, 226b to prevent the patterned metal substrate 216 from being corroded and/or to improve the ability to apply other electrical connectors to the patterned metal substrate 216. In other embodiments, the materials 226a, 226b may not be applied to the patterned metal substrate 216 and the electrical connectors are applied directly to the metal substrate 216.

At 212, a semiconductor device 228 is coupled to the overlap portion 224c. A semiconductor device 228 is electrically connected to the patterned metal substrate 216 via metal wires 230a, 230b using any wire bonding technique.

At 214, the bottom surface of the patterned metal substrate 216 is removed using any grinding, etching, or any other material removal technique. Portions of the bottom of the patterned metal substrate 216 are removed until the bottom of the patterned metal substrate 216 is substantially flush with the bottom surface of the insulating material 218. Once the removal process is completed, the majority of the metal wires 230a, 230b are electrically isolated from each other even though they are coupled to many different portions of the same underlying substrate 216. For instance, the lower contact regions 232a, 232b are electrically isolated from each other. The lower contact regions 232a, 232b may also be treated to facilitate soldering to a solder ball (not shown). Alternatively, the soldering process can enable QFN packaging techniques that enable the lower contact regions 232a, 232b to be secured flushly to a printed circuit board (not shown).

Figure 3:
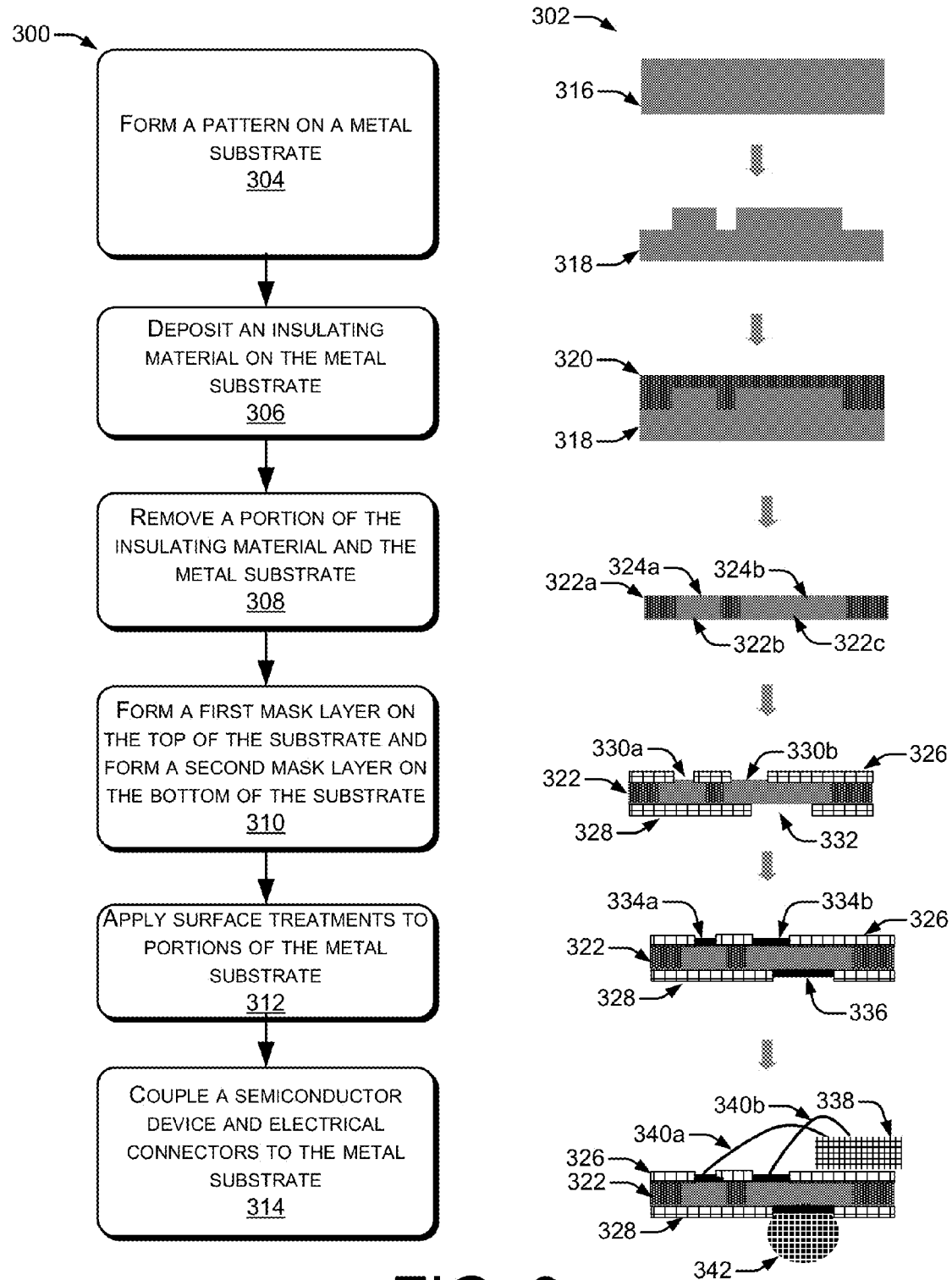
FIG. 3 illustrates another process flow diagram that describes steps that can be used during manufacture of a semiconductor package along with side view illustrations that correspond to the steps in the process flow diagram.

FIG. 3 illustrates a process flow diagram 300 of steps that can be used during the manufacturing a semiconductor package, and also illustrates side view illustrations 302 corresponding to the steps in the process flow diagram 300. The side view illustrations for each step are located to the right of the step in the process flow diagram 300.

At 304, a metal substrate 316 is patterned to create a three dimensional pattern in the top surface of the metal substrate 316. In one embodiment, the metal substrate 316 is etched to create a patterned metal substrate 318 that will include the foundation for the semiconductor package. In this embodiment, the patterned metal substrate 318 is a two level pattern, as shown in FIG. 3 by cross sectional view.

At 306, an insulating material 320 is deposited on the top surface of the patterned metal substrate 318. The deposition process may include any chemical vapor deposition process or chemical bath that can conformably apply the insulating material to the patterned metal substrate 318.

At 308, portions of the patterned metal substrate 318 and the insulating material 320 are removed until metal substrate portions 324a, 324b are substantially flush with the insulating material portions 322a, 322b, 322c with regard to both the top surface and the bottom surface. For example, the removal process can include a grinding or chemical mechanical polishing process.

At 310, a first mask layer 326 is applied to the top surface of the portions 322, 324 and a second mask layer 328 is applied to the bottom surface of the portions 322, 324. The first mask layer 326 is deposited on the top surface and patterned to expose portions 330a, 330b of the metal substrate portions 324a, 324b. The first mask layer 326 comprises an insulating material that assists in electrically isolating metal substrate portions 324a, 324b from each other. The second mask layer 328 is deposited on the bottom surfaces of the portions 322a, 322b, 322c, 324a, 324b and patterned to expose portion 332 of the metal substrate portion 324b.

In one embodiment, the mask layers 326, 328 may be deposited separately. In another embodiment, the mask layers 326, 328 are deposited on the portions 322a, 322b, 322c, 324a, 324b at the same time. Each mask layer 326, 328 may be patterned at the same time or separately.

At 312, the exposed portions 330a, 330b, 332 of the metal substrate are coated or treated with materials 334a, 334b, 336 to prevent the metal substrate from being corroded and/or to improve the ability to apply other electrical connectors to the substrate. In other embodiments, the materials 334a, 334b, 336 may not be applied to the exposed portions 330a, 330b, 332 and the electrical connectors are applied directly to the exposed portions 330a, 330b, 332. Alternatively, the materials 334a, 334b may be coated on the exposed portions 330a, 330b but not to the exposed portion 332. Similarly, the materials 336 may be coated on the exposed portion 332 and not the exposed portions 330a, 330b. Determining whether to apply or not apply the materials 334a, 334b, 336 is dependent upon the packaging technique being used and the performance or reliability required for a semiconductor device 338.

At 314, the semiconductor device 338 is coupled to the first mask layer 326. In one embodiment, the device is wire bonded to the coated (or uncoated depending upon the packaging technique) exposed portions 330a, 330b using metal wires 340a, 340b. In another embodiment, the device is coupled directly to the coated (or uncoated) exposed portions 330a, 330b using an electrical connector, such as a metal sphere (not shown) (e.g., flip-chip). The coated (or uncoated) exposed portion 332 also includes another electrical connector that can be used to couple the exposed portion 332 to a printed circuit board (not shown). In one embodiment, a metal sphere or solder ball 342 is used as the electrical connector on the coated (or uncoated) exposed portion 332.

Figure 4:
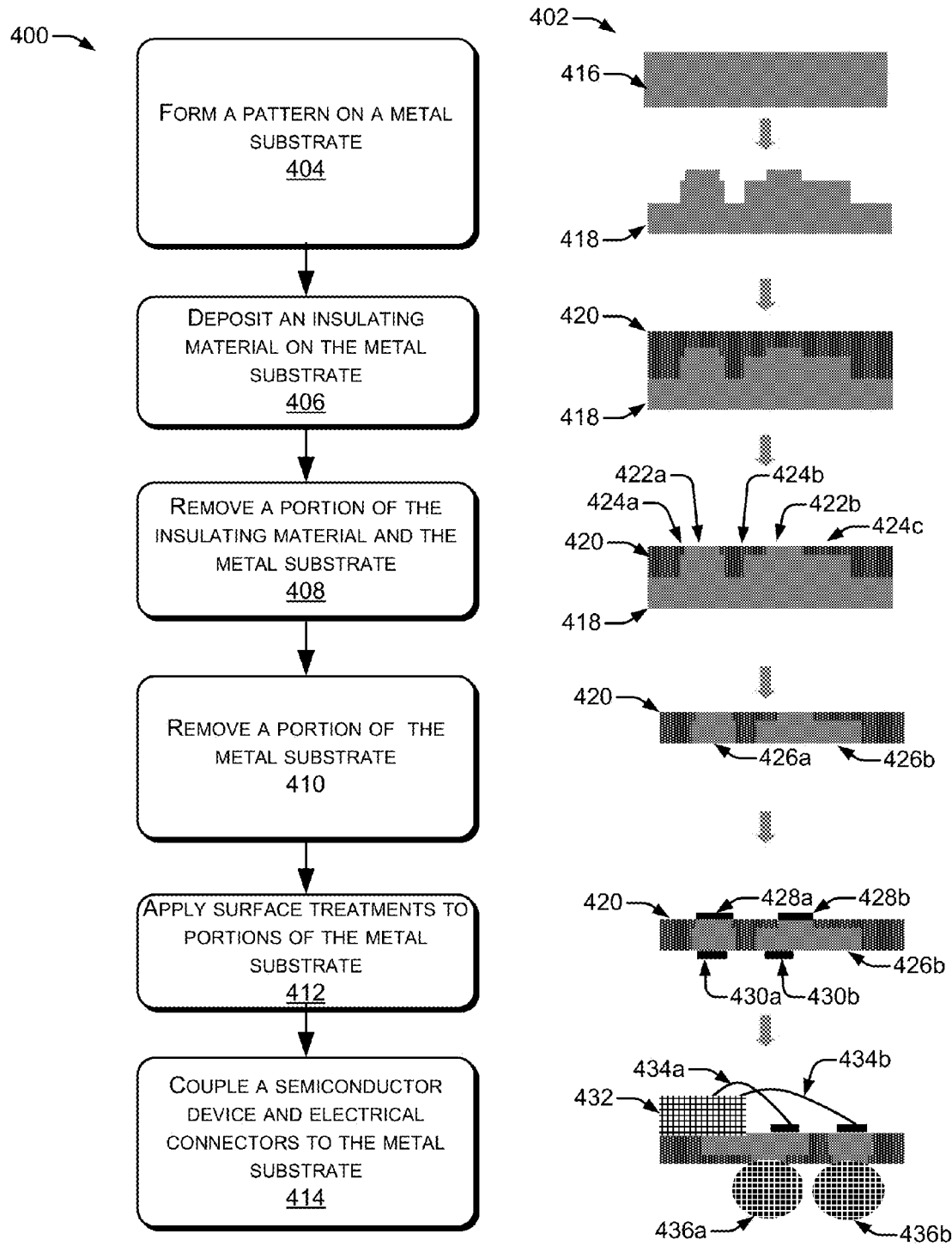
FIG. 4 illustrates another process flow diagram that describes steps that can be used during manufacture of a semiconductor package along with side view illustrations that correspond to the steps in the process flow diagram.

FIG. 4 illustrates a process flow diagram 400 of steps that can be used during the manufacturing a semiconductor package, and also illustrates side view illustrations 402 corresponding to the steps in the process flow diagram 400. The side view illustrations for each step are located to the right of the step in the process flow diagram 400.

At 404, a metal substrate 416 is patterned to create a three dimensional pattern in the top surface of the metal substrate 418. In one embodiment, the metal substrate 416 is etched to create a patterned substrate 418 that will include the foundation for the semiconductor package. In this embodiment, the patterned substrate 418 is shown in a cross sectional view that includes a multi-level pattern that includes three levels. In another embodiment, more than three levels can be used as the substrate pattern.

At 406, an insulating material 420 is deposited on the top surface of the patterned metal substrate 418. The insulating material can be any type of epoxy based material (e.g., Intervia™, Dow Chemical Co., 1500 John Tipton Blvd., Pennsauken, N.J. 08110) or silicon based material (e.g., $SiO_2$, $Si_2N_4$, Tetraethyl Orthosilicate (TEOS), Boronphosphosilicate glass (BPSG) or Phosphossilicte glass (PSG)). The deposition process may include any chemical vapor deposition process or chemical bath that can conformably apply the insulating material to the substrate 418.

At 408, the insulating material 420 is polished or etched such that the top surface of the patterned metal substrate 43.8 is substantially flush with the top surface of the insulating material 420. Following the removal of the insulating material 420, portions 422a, 422b of the metal substrate 418 are exposed. These portions 422a, 422b define upper contact areas to which electrical connections may be made. Additionally, portions 424a, 424b, 424c of the dielectric material 420 are left overlapping the exposed portions 422a, 422b of the patterned metal substrate 418.

At 410, the bottom surface of the patterned metal substrate 418 is polished or etched to make the bottom surface of the patterned metal substrate 418 substantially flush with the bottom surface of the insulating material 420. Following the removal of the insulating material 420, portions 426a, 426b of the patterned metal substrate 418 are exposed. These portions 426a, 426b define lower contact areas to which electrical connections may be made.

At 412, the exposed portions 422a, 422b, 426a, 426b of the patterned metal substrate 418 are coated or treated with materials 428a, 428b, 430a, 430b to prevent the patterned metal substrate from being corroded and/or to improve the ability to apply other electrical connectors to the substrate. In another embodiment, the materials 428a, 428b may not be applied to the exposed portions 422a, 422b, 426a, 426b and the electrical connectors are applied directly to the exposed portions 422a, 422b, 426a, 426b.

At 414, a semiconductor device 432 is coupled to the bottom of the insulating portion 424c. The semiconductor device 432 is electrically connected to the exposed portions 426a, 426b via metal wires 434a, 434b using any wire bonding technique. Metal spheres 436a, 436b are then coupled to the bottom surface of the exposed portions 422a, 422b. The metal spheres 436a, 436b are used to connect the exposed portions 422a, 422b to a printed circuit board (not shown).

In another embodiment, metal spheres are coupled to the bottom surface of the semiconductor device 432 (not shown) instead of directly coupling the device to the bottom of the insulating portion 424b. Once the spheres are coupled to the semiconductor device 432, the metal spheres are then coupled to the bottom of the insulating portion 424b (e.g., flip-chip).

The descriptions above may use perspective-based descriptions such as up/down, over/under, and/or top/bottom. Such descriptions are merely used to facilitate the discussion and are not intended to restrict the application of embodiments described herein to any particular orientation.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

The terms chip, integrated circuit, monolithic device, semiconductor device, die, and microelectronic device are often used interchangeably in the microelectronics field. The present invention is applicable to all of the above as they are generally understood in the field.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A method comprising:
   forming a three-dimensional pattern on a top surface of a metal substrate, wherein the three-dimensional pattern on the top surface of the metal substrate defines a first level and a second level of the top surface of the metal substrate, wherein the first level of the top surface of the metal substrate is above the second level of the top surface of the metal substrate, wherein the top surface of the metal substrate is opposite to a bottom surface of the metal substrate;
   depositing dielectric material over the top surface of the metal substrate, wherein the dielectric material has (i) a top surface and (ii) a bottom surface that is opposite to the top surface, and wherein the bottom surface of the dielectric material is in contact with the top surface of the metal substrate subsequent to the dielectric material being deposited over the top surface of the metal substrate;
   subsequent to depositing the dielectric material over the top surface of the metal substrate, selectively removing the dielectric material from the top surface of the metal substrate, wherein subsequent to selectively removing the dielectric material, (i) a first portion of the first level of the top surface of the metal substrate is exposed through the dielectric material and (ii) the top surface of the dielectric material is substantially flush with the first level of the top surface of the metal substrate; and
   removing a portion of the bottom surface of the metal substrate such that a first section of the bottom surface of the dielectric material is exposed through the bottom surface of the metal surface.

2. The method of claim 1, wherein removing the portion of the bottom surface of the metal substrate further comprises:
   removing the portion of the bottom surface of the metal substrate such that the bottom surface of the metal substrate is substantially flush with the bottom surface of the dielectric material.

3. The method of claim 1, wherein removing the portion of the bottom surface of the metal substrate further comprises:
   removing the portion of the bottom surface of the metal substrate such that the metal substrate underneath the second level of the top surface of the metal substrate is substantially removed.

4. The method of claim 1, further comprising:
   applying a surface treatment to the first portion of the first level of the top surface of the metal substrate that is exposed through the dielectric material; and
   attaching a solder ball on the surface treated first portion of the first level of the top surface of the metal substrate.

5. The method of claim 1, wherein removing the portion of the bottom surface of the metal substrate further comprises:
   removing the portion of the bottom surface of the metal substrate such that the bottom surface of the dielectric material, which is exposed through the metal surface, defines a first portion of the bottom surface of the metal substrate that is substantially surrounded by the dielectric material.

6. The method of claim 1, wherein the metal substrate comprises one of aluminum or copper.

7. The method of claim 1, wherein an entirety of the top surface of the dielectric material is substantially flush with the first level of the top surface of the metal substrate.

8. The method of claim 1, further comprising:
   subsequent to selectively removing the dielectric material, attaching a semiconductor device on the dielectric material.

9. The method of claim 8, wherein the semiconductor device is attached on the dielectric material such that an entirety of a bottom surface of the semiconductor device is attached to the dielectric material, without any section of the bottom surface of the semiconductor device being attached to the metal substrate.

10. The method of claim 8, wherein the semiconductor device is attached on the dielectric material such that (i) a first section of a bottom surface of the semiconductor device is attached to the dielectric material, and (ii) a second section of the bottom surface of the semiconductor device is attached to the metal substrate.

11. The method of claim 8, further comprising:
coupling an electrical connector between the semiconductor device and the first portion of the first level of the top surface of the metal substrate.

12. The method of claim 11, wherein coupling the electrical connector between the semiconductor device and the first portion of the first level of the top surface of the metal substrate further comprises:
applying a surface treatment to the first portion of the first level of the top surface of the metal substrate that is exposed through the dielectric material; and
coupling the electrical connector between the semiconductor device and the surface treated first portion of the first level of the top surface of the metal substrate.

13. The method of claim 1, further comprising:
applying a surface treatment to the first portion of the first level of the top surface of the metal substrate that is exposed through the dielectric material; and
attaching an electrical connector to the surface treated first portion of the first level of the top surface of the metal substrate.

14. The method of claim 13, wherein the electrical connector comprises one of (i) a metal wire and (ii) a metal sphere.

* * * * *